(12) United States Patent
Lan et al.

(10) Patent No.: US 9,988,264 B2
(45) Date of Patent: Jun. 5, 2018

(54) METHOD OF FABRICATING INTEGRATED STRUCTURE FOR MEMS DEVICE AND SEMICONDUCTOR DEVICE

(71) Applicant: UNITED MICROELECTRONICS CORP., Hsin-Chu (TW)

(72) Inventors: Bang-Chiang Lan, Taipei (TW); Li-Hsun Ho, Hsinchu County (TW); Wei-Cheng Wu, Hsinchu County (TW); Hui-Min Wu, Hsinchu County (TW); Min Chen, New Taipei (TW); Tzung-I Su, Yun-Lin County (TW); Chien-Hsin Huang, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 113 days.

(21) Appl. No.: 14/489,495

(22) Filed: Sep. 18, 2014

(65) Prior Publication Data

US 2015/0004732 A1  Jan. 1, 2015

Related U.S. Application Data

(62) Division of application No. 12/056,286, filed on Mar. 27, 2008, now Pat. No. 8,872,287.

(51) Int. Cl.
*H01L 21/00* (2006.01)
*B81C 1/00* (2006.01)
*H01L 27/06* (2006.01)

(52) U.S. Cl.
CPC ...... *B81C 1/00246* (2013.01); *B81C 1/00801* (2013.01); *B81C 2201/014* (2013.01);
(Continued)

(58) Field of Classification Search
CPC .................................................. B81C 1/00246
(Continued)

(56) References Cited

U.S. PATENT DOCUMENTS

| | | |
|---|---|---|
| 6,531,331 B1 | 3/2003 | Bennett |
| 6,872,902 B2 | 3/2005 | Cohn et al. |

(Continued)

FOREIGN PATENT DOCUMENTS

| | | |
|---|---|---|
| JP | 2004282514 A | 10/2004 |
| JP | 2006263902 A | 10/2006 |

(Continued)

*Primary Examiner* — Hsin-Yi Hsieh
(74) *Attorney, Agent, or Firm* — Winston Hsu

(57) ABSTRACT

A method of fabricating an integrated structure for MEMS device and semiconductor device comprises steps of: providing a substrate having a transistor thereon in a semiconductor device region and a first MEMS component thereon in a MEMS region; performing a interconnect process on the substrate in the semiconductor device region to form a plurality of first dielectric layers, at least a conductive plug and at least a conductive layer in the first dielectric layers; forming a plurality of second dielectric layers and an etch stopping device in the second dielectric layers on the substrate in a etch stopping device region; forming a plurality of third dielectric layers and at least a second MEMS component in the third dielectric layers on the substrate in the MEMS region; and performing an etching process to remove the third dielectric layers in the MEMS region.

10 Claims, 6 Drawing Sheets

(52) U.S. Cl.
CPC ............. *B81C 2203/0714* (2013.01); *B81C 2203/0742* (2013.01); *B81C 2203/0792* (2013.01); *H01L 27/0688* (2013.01)

(58) Field of Classification Search
USPC .......................................... 438/50
See application file for complete search history.

(56) References Cited

U.S. PATENT DOCUMENTS

| | | |
|---|---|---|
| 7,208,809 B2 | 4/2007 | Urano |
| 7,321,457 B2 | 1/2008 | Heald |
| 7,767,484 B2 | 8/2010 | Ayazi |
| 7,923,790 B1 * | 4/2011 | Quevy .................. B81B 7/02 257/414 |
| 2002/0151132 A1 | 10/2002 | Hsu |
| 2005/0000932 A1 | 1/2005 | Gabriel |
| 2005/0076719 A1 | 4/2005 | Jakobsen et al. |
| 2007/0040270 A1 | 2/2007 | Coenen |
| 2008/0105951 A1 | 5/2008 | Sato |
| 2009/0090693 A1 | 4/2009 | Wang |
| 2010/0044808 A1 | 2/2010 | Dekker |

FOREIGN PATENT DOCUMENTS

| | | |
|---|---|---|
| JP | 2007111832 A | 5/2007 |
| JP | 2007305810 A | 11/2007 |
| TW | 200526513 | 8/2005 |
| TW | 200732246 | 9/2007 |
| TW | 200742107 | 11/2007 |

* cited by examiner

US 9,988,264 B2

1

METHOD OF FABRICATING INTEGRATED STRUCTURE FOR MEMS DEVICE AND SEMICONDUCTOR DEVICE

CROSS REFERENCE TO RELATED APPLICATIONS

This application is a division of U.S. application Ser. No. 12/056,286 filed Mar. 27, 2008, and incorporated herein by reference in its entirety.

BACKGROUND OF THE INVENTION

1. Field of the Invention

The present invention relates to an integrated structure for a microelectromechanical system (MEMS) device and a semiconductor device and a method of fabricating such integrated structure for a MEMS device and a semiconductor device.

2. Description of the Prior Art

MEMS devices include micromachines integrated with electronic microcircuits on substrates. Such devices may form, for example, microsensors or microactuators which operate based on, for example, electromagnetic, electrostrictive, thermoelectric, piezoelectric, or piezoresistive effects. MEMS devices have been formed on insulators or other substrates using micro-electronic techniques such as photolithography, vapor deposition, and etching. Recently, MEMS is fabricated using the same types of steps (such as the deposition of layers of material and the selective removal of the layers of material) that are used to fabricate conventional analog and digital complementary metal oxide semiconductor (CMOS) circuits.

Additional equipment are not needed if the mass production of the MEMS elements uses the techniques for production of the CMOS devices. The materials generally used for production of the CMOS devices are also can be used. However, the MEMS production has its peculiarity that causes certain problems and difficulties to integrate the semiconductor device production. For example, a release process by means of wet etching is used to make some MEMS components. A sacrificed silicon oxide layer is dissolved by, for example, an HF (hydrogen fluoride) etchant during the release process, and then the MEMS components are separated from each other in thus formed vacant space. Nevertheless, the dielectric layer adjacent to the sacrificed silicon oxide layer and having the semiconductor device therein tends to be damaged during such process. An alternative way to perform the release process is to use HF gas, while water vapor is still needed to activate the release process. In the conventional processes, the release process performed by either wet etching or vapor etching brings lateral damage to the dielectric layer of the CMOS device.

Accordingly, a novel integrated structure for a MEMS device and a semiconductor device and a method of fabricating the same is still needed to allow the MEMS device fabrication to be compatible with the CMOS device fabrication.

SUMMARY OF THE INVENTION

One objective of the present invention is to provide an integrated structure for a MEMS device and a semiconductor device and a fabricating method thereof, so as to avoid corrosion of the semiconductor device by etchants during the MEMS device fabrication.

2

The integrated structure for a MEMS device and a semiconductor device according to the present invention comprises a substrate; a dielectric layer formed on the substrate; a MEMS device formed in the substrate or the dielectric layer; a semiconductor device formed in the substrate or the dielectric layer; and an etch stopping device formed on the substrate and in the dielectric layer between the MEMS device and the semiconductor device, thereby to protect the semiconductor device from being etched during a release process for making the MEMS device.

The method of fabricating an integrated structure for a MEMS device and a semiconductor device comprises steps of providing a substrate, wherein the substrate comprises a MEMS region, an etch stopping device region, and a semiconductor device region, the MEMS region is separated from the semiconductor device region by the etch stopping device region, a transistor is disposed on the substrate in the semiconductor device region, and a first MEMS component is disposed on the substrate in the MEMS region; performing a interconnect process on the substrate in the semiconductor device region to form a plurality of first dielectric layers, at least a conductive plug and at least a conductive layer in the first dielectric layers; forming a plurality of second dielectric layers and an etch stopping device in the second dielectric layers on the substrate in the etch stopping device region; forming a plurality of third dielectric layers and at least a second MEMS component in the third dielectric layers on the substrate in the MEMS region; and performing an etching process to remove the third dielectric layers in the MEMS region.

Since, in the integrated structure for a MEMS device and a semiconductor device according to the present invention, an etch stopping device is disposed between the MEMS device and the semiconductor device, the etch stopping device serves as an etch barrier for preventing the semiconductor device from being corroded by etchants during a release process to etch silicon oxide for making the MEMS device. Furthermore, the formation of such etch stopping device is compatible with the semiconductor device (such as CMOS) fabrication. For example, when an interconnect process is used to form the etch stopping device and the interconnects of the semiconductor device simultaneously, it is not necessary to use materials, manufacturing processes, manufacturing equipment, and the like other than those usually used in the semiconductor device fabrication. In other words, the fabricating processes of the etch stopping device, the semiconductor device, and the MEMS device are compatible and can be integrated.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
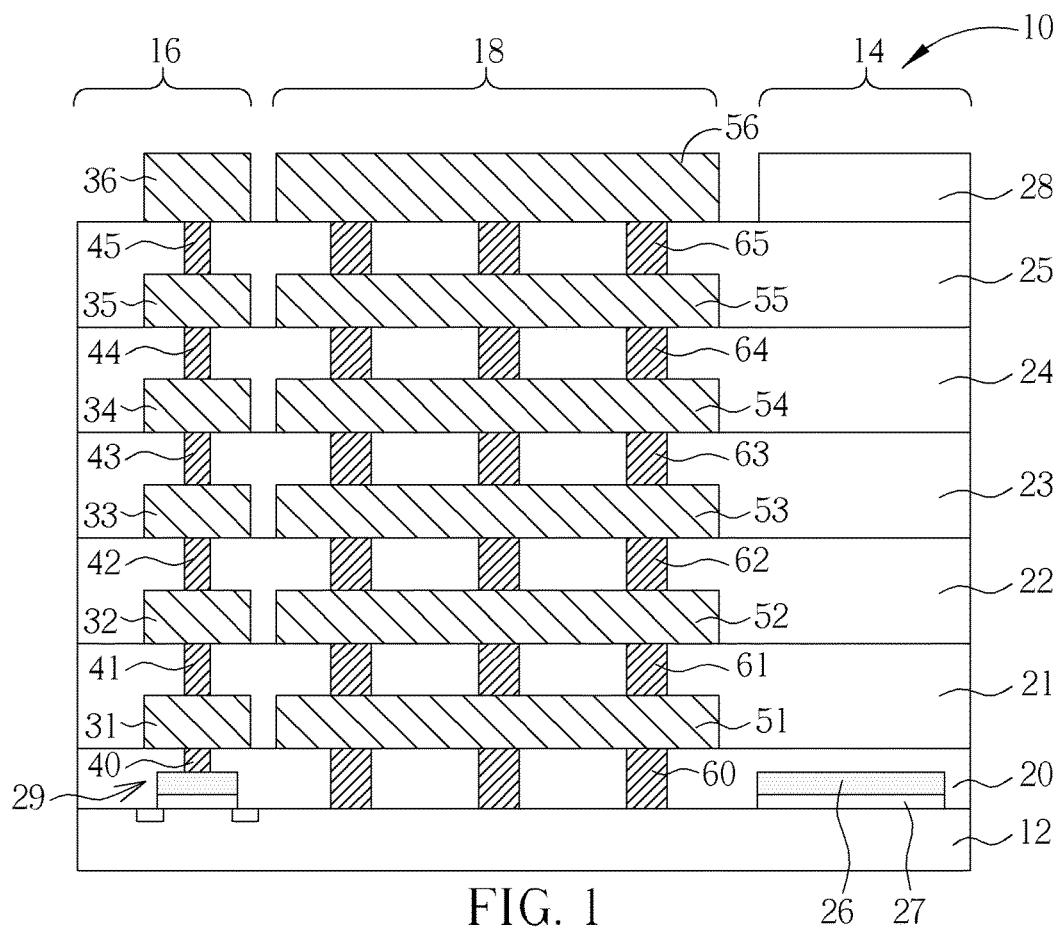
FIG. 1 is a schematic cross-sectional view showing an embodiment of the integrated structure for a MEMS device and a semiconductor device according to the present invention.

The integrated structure for a MEMS device and a semiconductor device according to the present invention mainly comprises an etch stopping device formed between the MEMS device and the semiconductor device. In the semiconductor device, a interconnect process is generally performed on the substrate to form a plurality of dielectric layers (or they may be deemed as a whole layer), conductive plugs, and conductive layers. For convenience, the etch stopping device of the present invention may be formed simultaneously with the conductive plugs or the conductive layer using the interconnect process. The semiconductor device may comprise for example, MOS transistors, such as PMOS, NMOS, or CMOS devices.

In the present invention, the etch stopping device formed between the MEMS device and the semiconductor device to protect the semiconductor device during the release process for making the MEMS device. The etch stopping device may be formed alone or together with the formation of the semiconductor device, and the latter is preferred. The etch stopping device may have various profiles, such as, a single or multiple etching barriers each in a form of a single component or a stack of components, formed between the semiconductor device and the MEMS device.

In case the etching barrier is in the form of a single component, the etch stopping device may comprise a plurality of rows of a plurality of pillared etch-resistant material plugs or one or a plurality of wall-shaped etch-resistant material plugs disposed between the semiconductor device and the MEMS device. The term, "a plurality of rows", of the "a plurality of rows of a plurality of pillared etch-resistant material plugs" means two or more rows each having a plurality of pillared etch-resistant material plugs.

In case of the combination of stacked etching barriers, the etch stopping device may comprise a stack of at least a set of following components: a plurality of pillared etch-resistant material plugs arranged in a plurality of rows and an etch-resistant material layer stacked with each other in the dielectric layer; or one or more wall-shaped etch-resistant material plugs and an etch-resistant material layer stacked with each other in the dielectric layer. The up/down order thereof is not particularly limited. That is, the plurality of rows of the plurality of pillared etch-resistant material plugs may be the upper one, and the etch-resistant material layer may be the lower one in the stack; or the etch-resistant material layer may be the upper one, and the plurality of rows of the plurality of pillared etch-resistant material plugs may be the lower one in the stack. Likewise, the wall-shaped etch-resistant material plugs may be the upper one, and the etch-resistant material layer may be the lower one in the stack; or the etch-resistant material layer may be the upper one, and the wall-shaped etch-resistant material plugs may be the lower one in the stack.

Regarding to the plurality of rows of the plurality of pillared etch-resistant material plugs, the term, "a plurality of rows," means two or more rows, with a plurality of pillared etch-resistant material plugs in each row. The arrangement of the plurality of rows of the plurality of pillared etch-resistant material plugs is preferably in a way such that the pillared etch-resistant material plugs of one row and the pillared etch-resistant material plugs of an adjacent row are arranged in stagger with respect to each other, for resulting a more efficient etchant blocking effect. The etch stopping device may comprise one or more sets of such structure as described above. A plurality of sets of such structure may be stacked in an up-down direction to reach a height equivalent to or higher than the height of the MEMS region.

The size of the etch stopping device may be as desired and not particularly limited. For example, it may depend on the fabrication techniques, materials, a desired size of the integrated structure, desired protective effect, and the like.

The etch resistant material is basically the material which can resist the etching in the release process to make the MEMS device. For example, when an HF-based etchant is utilized to wet etch or vapor etch silicon oxide in the release process, an HF-resistant material is used to serve the etch resistant material. The HF-resistant material may be for example metal or polysilicon, but is not limited thereto. Among these, the metal may be one of those usually used in the semiconductor device fabrication, for example aluminum, copper, tungsten, or the like.

In the present invention, the etch stopping device is formed between the semiconductor device and the MEMS device, and furthermore the etch stopping device may surround the MEMS device to form a complete protection for the region other than the MEMS device region.

FIG. 1 is a schematic cross-sectional view showing an embodiment of the integrated structure for a MEMS device and a semiconductor device according to the present invention. As shown in FIG. 1, an integrated structure for a MEMS device and a semiconductor device 10 includes a substrate 12. The substrate 12 may be a semiconductor substrate. Dielectric layers 21, 22, 23, 24, and 25 are formed on the substrate 12. The dielectric layers may be silicon oxide layers. A MEMS device 14 is formed in the substrate 12 and the dielectric layers. A semiconductor device 16 is formed in the substrate 12 and the dielectric layers. A etch stopping device 18 is formed on the substrate 12 and the dielectric layers between the MEMS device 14 and the semiconductor device 16. In FIG. 1, the MEMS device 14 is partly shown and comprises a polysilicon layer 26, an oxide layer 27 between the polysilicon 26 and the substrate 12, and a metal layer 28 on the surface of the dielectric layer 25. The semiconductor device 16 includes a transistor 29, conductive layers 31, 32, 33, 34, 35, and 36, conductive plugs 40, 41, 42, 43, 44, and 45, and may include additional transistors, conductive layers, and conductive plugs. The etch stopping device 18 includes a plurality of etch-resistant material layers 51, 52, 53, 54, 55, and 56, and a plurality of wall-shaped etch-resistant material plugs 60, 61, 62, 63, 64, and 65. In this embodiment, three wall-shaped etch-resistant material plugs are disposed in each dielectric layer and stacked with the etch-resistant material layers.

Figure 2:
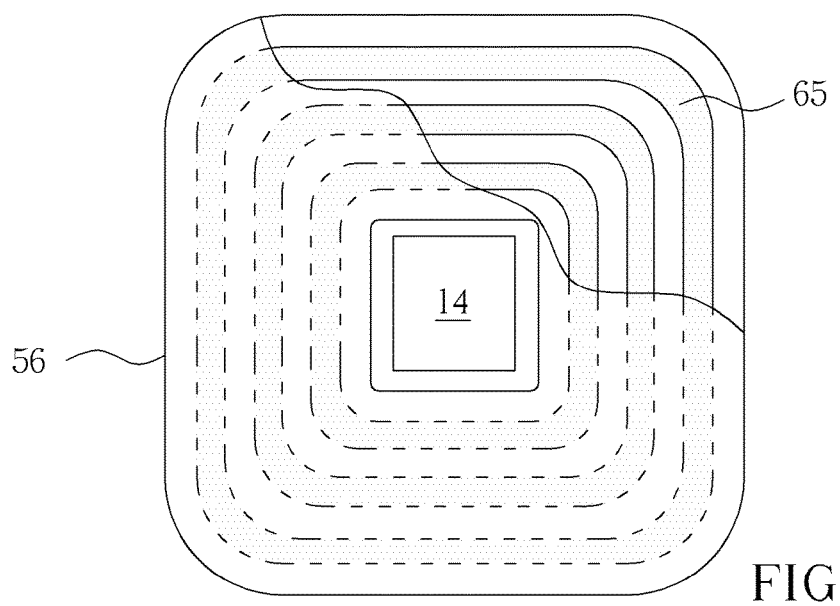
FIG. 2 is a schematic top view showing the MEMS device surrounded by the etch stopping device in an embodiment of the integrated structure for a MEMS device and a semiconductor device according to the present invention.

The etch stopping device may be formed in a configuration to surround the MEMS device for sure protection. FIG. 2 is a schematic top view showing the MEMS device 14 further surrounded by the etch stopping device 18. It clearly shows that the etch-resistant material layer 56 and a plurality of wall-shaped etch-resistant material plugs 65 of the etch stopping device 18 surround the MEMS device 14.

Figure 3:
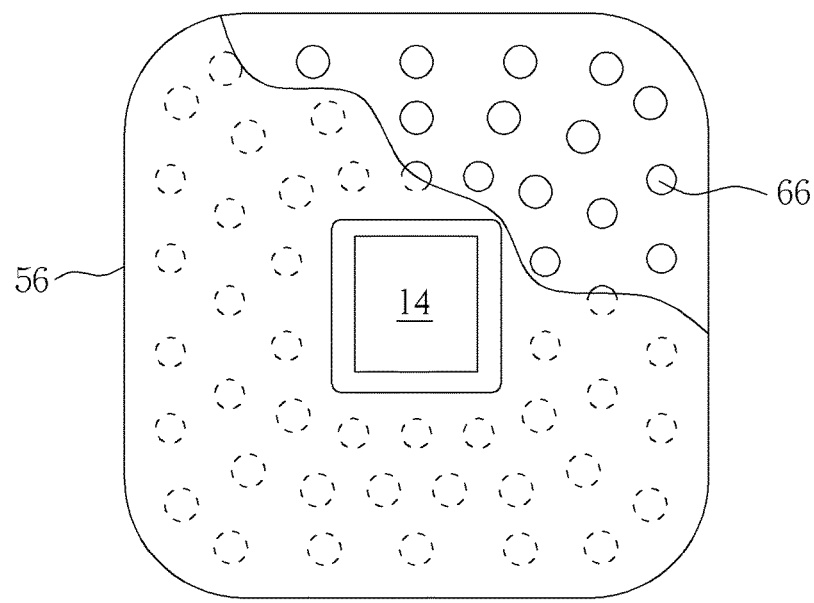
FIG. 3 is a schematic top view showing the MEMS device surrounded by the etch stopping device in another embodiment of the integrated structure for a MEMS device and a semiconductor device according to the present invention.
Figure 4:
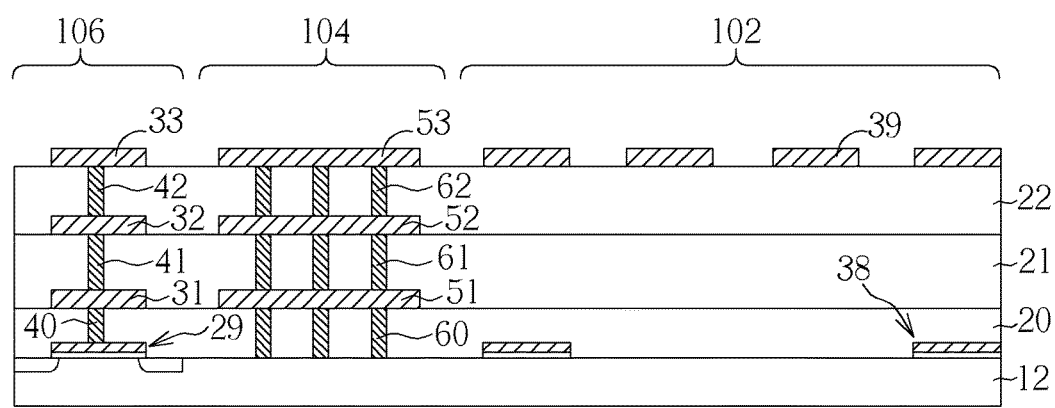
FIGS. 4-10 are schematic cross-sectional views showing an embodiment of the method of fabricating an integrated structure for a MEMS device and a semiconductor device according to the present invention.

FIG. 3 is a schematic top view showing the MEMS device 14 surrounded by the etch stopping device in another embodiment. In FIG. 3, the etch stopping device comprises a plurality of rows of a plurality of pillared etch-resistant material plugs 66 and the etch-resistant material layer 56. It is noted that the pillared etch-resistant material plugs 66 of two adjacent rows are arranged in stagger.

The method of fabricating the integrated structure for a MEMS device and a semiconductor device according to the present invention mainly includes a step of forming an etch stopping device between the MEMS device and the semiconductor device. The etch stopping device is preferably formed in the fabrication process for the semiconductor device. For example, the pillared or wall-shaped etch-resistant material plugs and the etch-resistant material layer are formed simultaneously with the formation of the conductive plugs and the conductive layer in the same process (such as an interconnect process). Accordingly, the pillared or wall-shaped etch-resistant material plugs may comprise the same material as the conductive plugs; and the etch-resistant material layer may comprise the same material as the conductive layer. Also, the MEMS device may be formed simultaneously with the formation of the semiconductor device (such as an interconnect process). Accordingly, the dielectric layers at a same altitude of the three regions are formed simultaneously and become one layer.

FIGS. 4-10 are schematic cross-sectional views showing an embodiment of the method of fabricating an integrated structure for a MEMS device and a semiconductor device according to the present invention. In this embodiment, the MEMS device is a microphone. Please refer to FIG. 4. First, a substrate 12 is provided. The substrate 12 has a MEMS region 102, an etch stopping device region 104, and a semiconductor device region 106. The MEMS region 102 is separated from the semiconductor device region 106 by the etch stopping device region 104. A transistor 29 is disposed on the substrate 12 in the semiconductor device region 106. A MEMS component 38 is disposed on the substrate 12 in the MEMS region 102. Thereafter, a dielectric layer 20, also referred to as interlayer dielectric (ILD), is formed on the substrate 12. The dielectric layer may comprise silicon oxide. After the dielectric layer is planarized, a photolithography process and an etching process are formed to form a via in the dielectric layer 20 in the semiconductor device region 106 and three trenches in the dielectric layer 20 in the etch stopping device region 104. Thereafter, a metal deposition and then a planarization process are performed to fill metal, such as tungsten, in the via and the trenches to form a conductive plug 40 and three wall-shaped etch-resistant material plugs 60 simultaneously. Thereafter, a metal layer (such as an aluminum layer) is deposited on the dielectric layer 20 and etched for patterning to form a conductive layer 31 stacked on the conductive plug 40 and an etch-resistant material layer 51 stacked on the three wall-shaped etch-resistant material plugs 60. Likewise, the dielectric layers 21 and 22, also referred to as inter-metal dielectric (IMD), the conductive plugs 41 and 42, the conductive layers 32 and 33, the wall-shaped etch-resistant material plugs 61 and 62, the etch-resistant material layers 52 and 53 are formed. Further, a microphone component 39 may be formed in the same step of forming the conductive layer 33 and the etch-resistant material layer 53.

Figure 5:
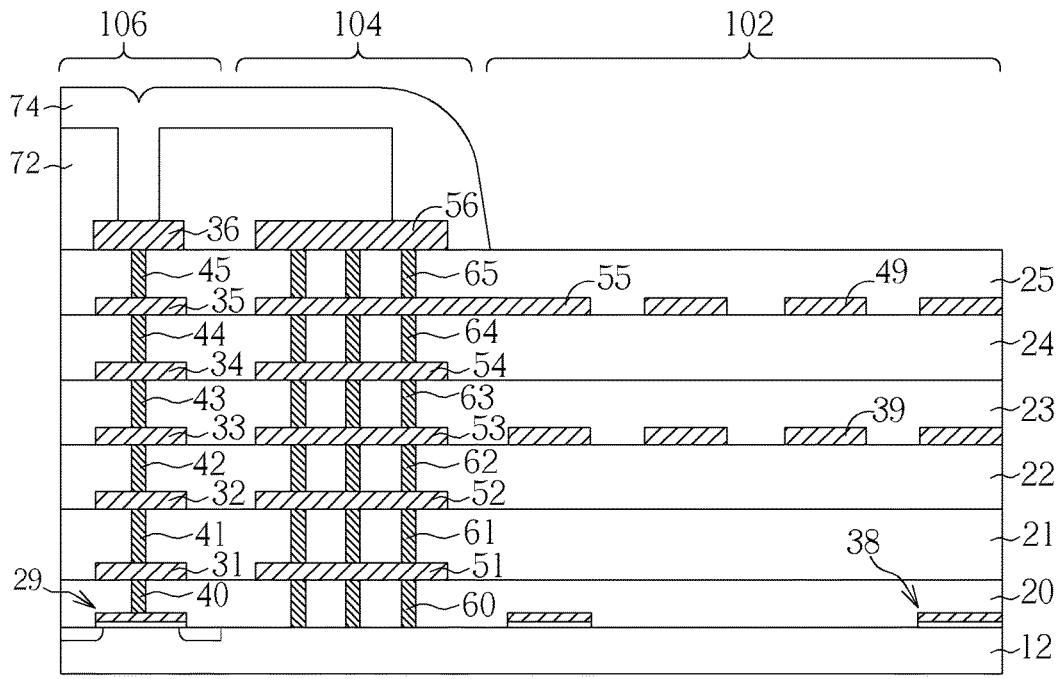
Figure 6:
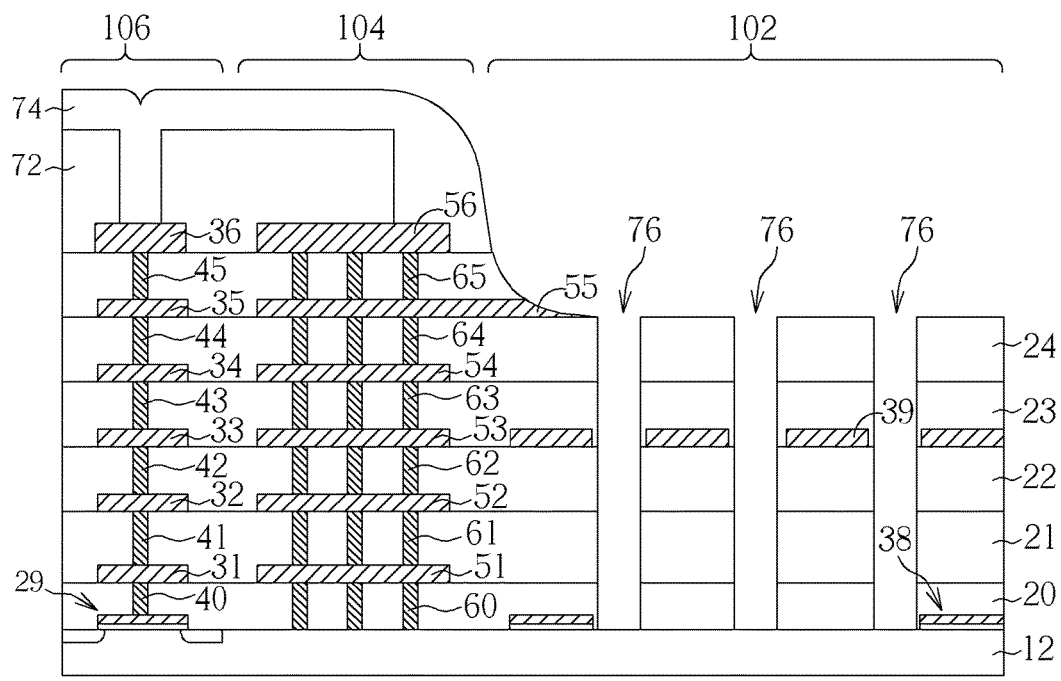
Figure 7:
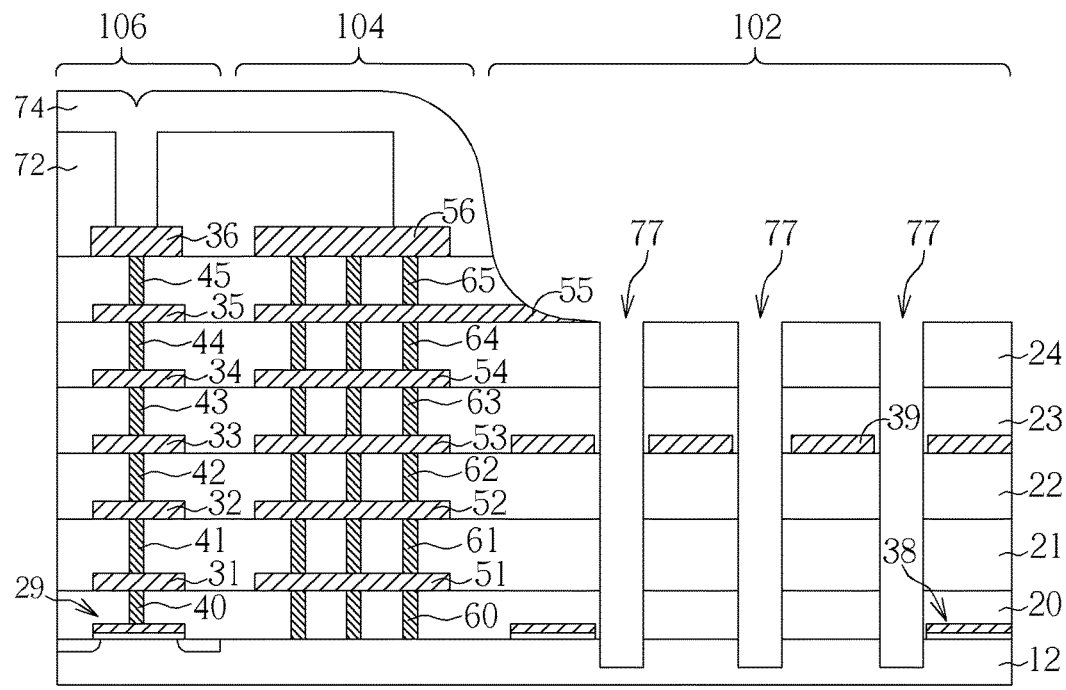
Figure 8:
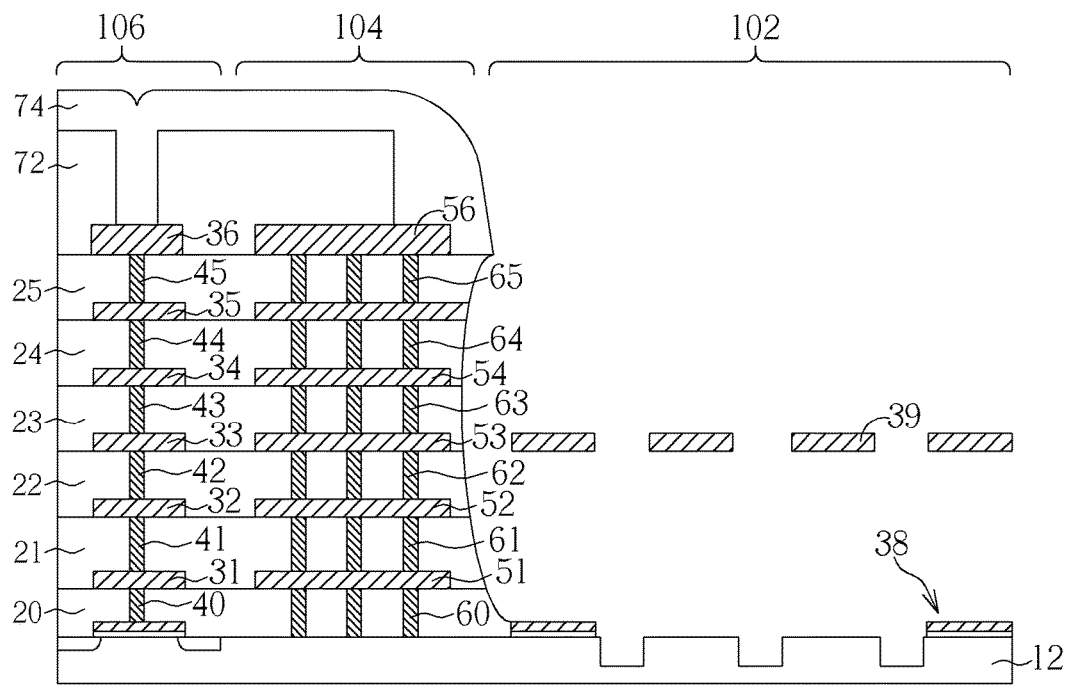

Thereafter, referring to FIG. 5, the dielectric layers 23, 24, and 25, the conductive plugs 43, 44, and 45, the conductive layers 34, 35, and 36, the wall-shaped etch-resistant material plugs 63, 64, and 65, the etch-resistant material layers 54, 55, and 56 are formed in the same way as described above. In addition, a metal layer 49 is formed at the position above the MEMS component 39 in the MEMS region 102 simultaneously with the formation of the conductive layer 35 and the etch-resistant material layer 55. Thereafter, a passivation layer 72 may be further formed to cover the semiconductor device region 106. The passivation layer 72 may be for example a stack of a TEOS oxide layer, a PSG layer, and a silicon nitride layer. A photo resist layer is then formed to cover the semiconductor device region 106 and the etch stopping device region 104 to serve as a mask in a subsequent etching process.

Thereafter, a release process in the MEMS region 102 is performed as follows. First, referring to FIG. 6, an anisotropic deep reactive-ion etching (DRIE) process for dry-etching silicon oxide is performed using the photo resist layer 74 as a mask to etch through the dielectric layers (silicon oxide layers) between any two adjacent components 39 to form openings 76 and expose the substrate 12. The dielectric layer 24, the metal layer 49, and a part of etch-resistant material layer 55 may be etched away during the etching process. Thereafter, referring to FIG. 7, an anisotropic deep reactive-ion etching (DRIE) process for dry-etching silicon is subsequently performed using the photo resist layer 74 as a mask to etch away a part of the substrate 12 at the bottom of the openings 76. The openings thereafter are denoted by 77. The portion of the dielectric layer, such as the dielectric layer 24, not covered by the photo resist layer 74 is incidentally removed. Thereafter, referring to FIG. 8, each dielectric layer in the MEMS region 102 is etched away using an isotropic wet etching or vapor etching process to make the components 39 to be a hollow-out pattern for serving as a vibration membrane of the microphone. When the dielectric layer is a silicon oxide layer, an etchant containing HF is preferably used. Although the isotropic etching is utilized, the semiconductor device and each dielectric layer in the semiconductor device region 106 are not suffered from the lateral damage in the etching process due to a good etching barrier as served by the etch stopping device in the etch stopping device region 104.

Figure 9:
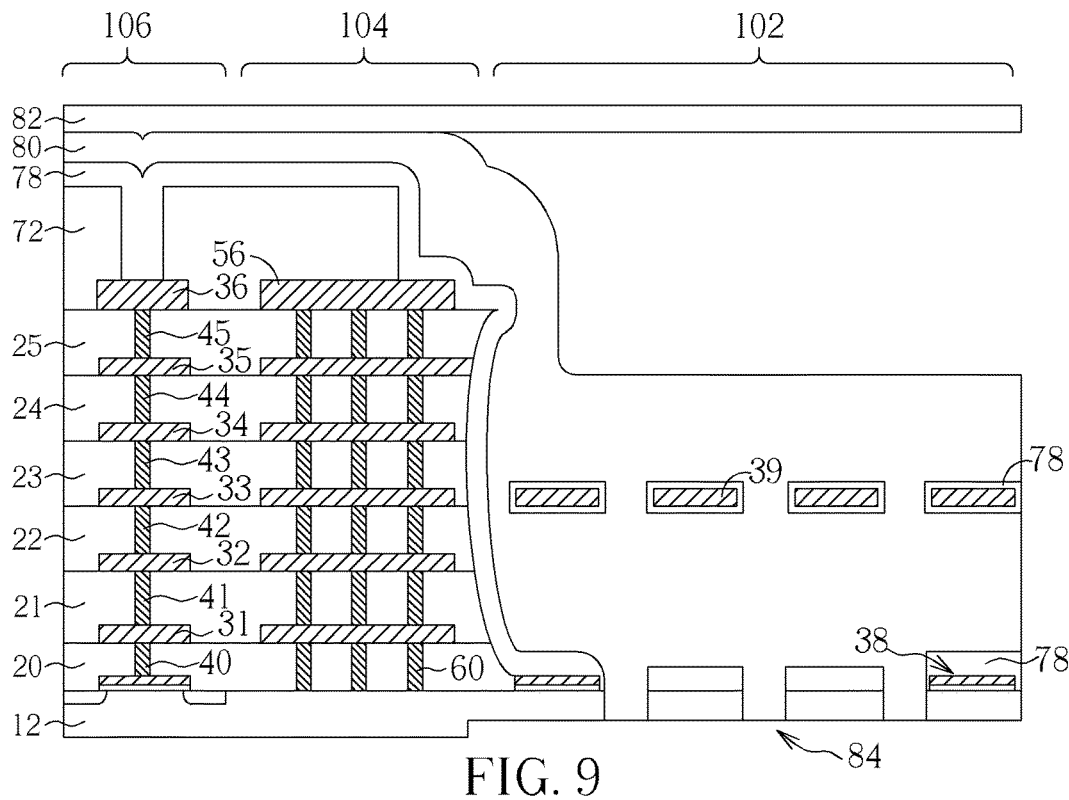
Figure 10:
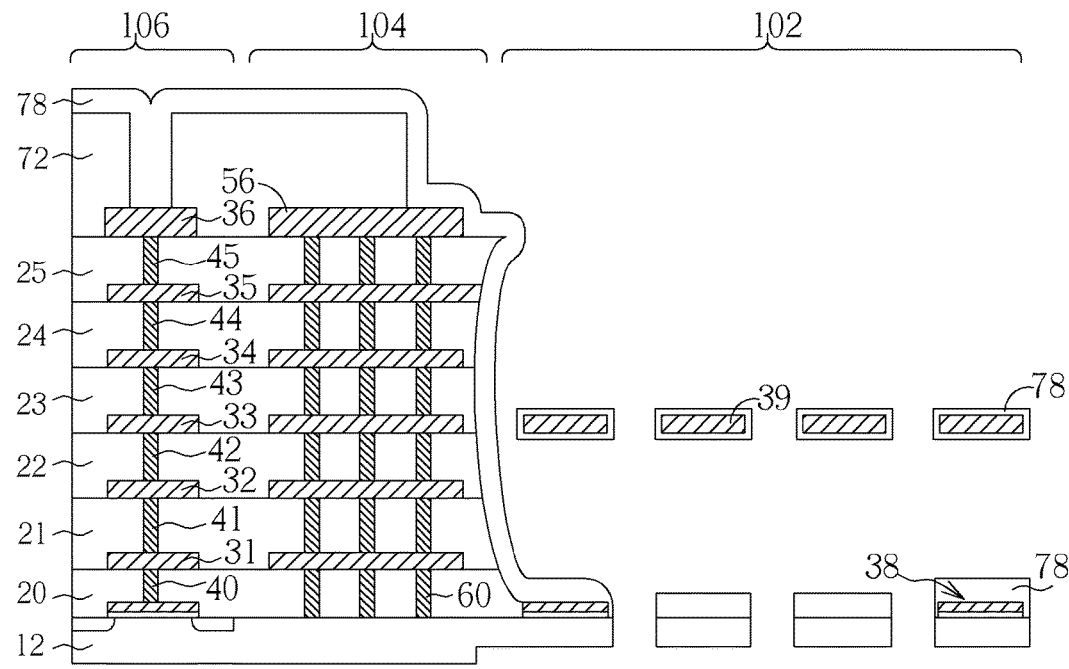

Thereafter, the formation of the MEMS device is continued. As shown in FIG. 9, the photo resist layer 74 is removed, and then an elastic layer 78 is applied conformally to allow the vibration membrane to have a better elasticity. The elastic layer 78 may comprise for example plastic rubber, Teflon, Pyralene (Trade name, a chemical compound of polychlorinated biphenyls), or polyamide. Thereafter, a photo resist layer 80 is formed conformally on the top surface (or referred to as the front side) of the substrate 12 and covers the components 39. A tape layer 82 is further applied to the front side for protecting the front side of the substrate during a back side etching process subsequently performed. Thereafter, a back side etching process is performed to etch through the substrate 12 in the MEMS region 102 to form a cavity 84. Subsequently, referring to FIG. 10, the tape layer 82 and the photo resist layer 80 are removed, and the vibration membrane of the microphone is formed.

Figure 11:
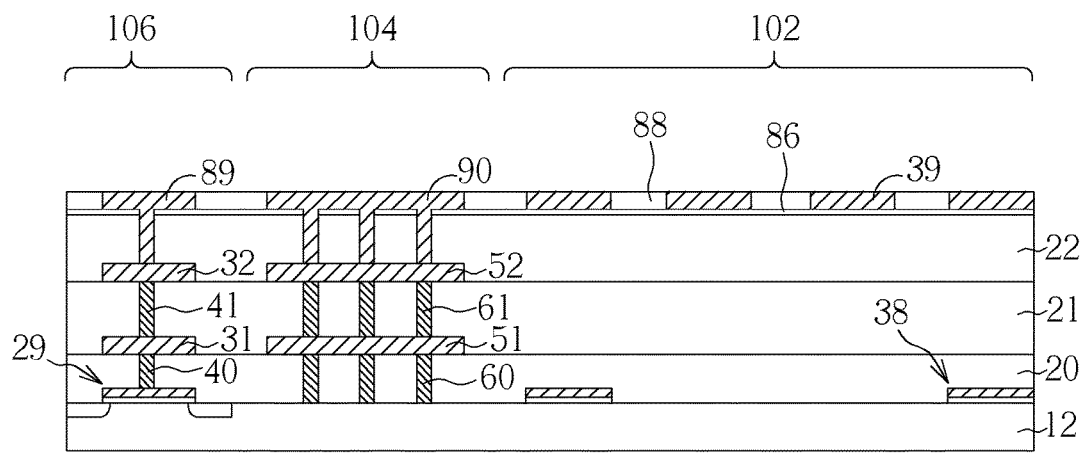
FIG. 11 is a schematic cross-sectional view showing an embodiment of forming the conductive layer, the conductive plug, the etch-resistant material layer, the etch-resistant material plug, and the MEMS components by a damascene process in the method of fabricating an integrated structure for a MEMS device and a semiconductor device according to the present invention.

In the method described above, all the conductive layers, etch-resistant material layers, MEMS components, or metal layers may be formed by etching processes, as well as damascene processes. FIG. 11 exemplarily illustrates a result for a dual damascene or a damascene process for forming some conductive layer, etch-resistant material layer, and MEMS components. For example, after the dielectric layer 22 is formed, an etch stop layer 86 is formed on the dielectric layer 22 and patterned to expose the dielectric layer 22 at the position corresponding to the conductive plugs and the etch-resistant material plugs. Thereafter, a dielectric layer 88 is formed. The dielectric layer 88 and the dielectric layer 22 are etched using a patterned photo resist layer (not shown) as a mask, to form openings for forming the conductive plugs, the conductive layer, the etch-resistant material plugs, the etch-resistant material layer, and the components 39. Thereafter, a metal layer (such as a copper layer) is deposited to fill the openings and then planarized, so as to form a dual damascene structure 89 of the conductive plugs and the conductive layer, a dual damascene structure 90 of the etch-resistant material plugs and the etch-resistant material layer, and the components 39 having a damascene structure.

The damascene structure described above is an example, while the present invention is not limited thereto. That is, the stacked configuration also can be that, for example, the wall-shaped etch-resistant material plugs are formed as the lower layer, and the etch-resistant material layer is stacked thereon. The same situation is applicable to the stacked structure of the pillared etch-resistant material plugs and the etch-resistant material layer.

Figure 12:
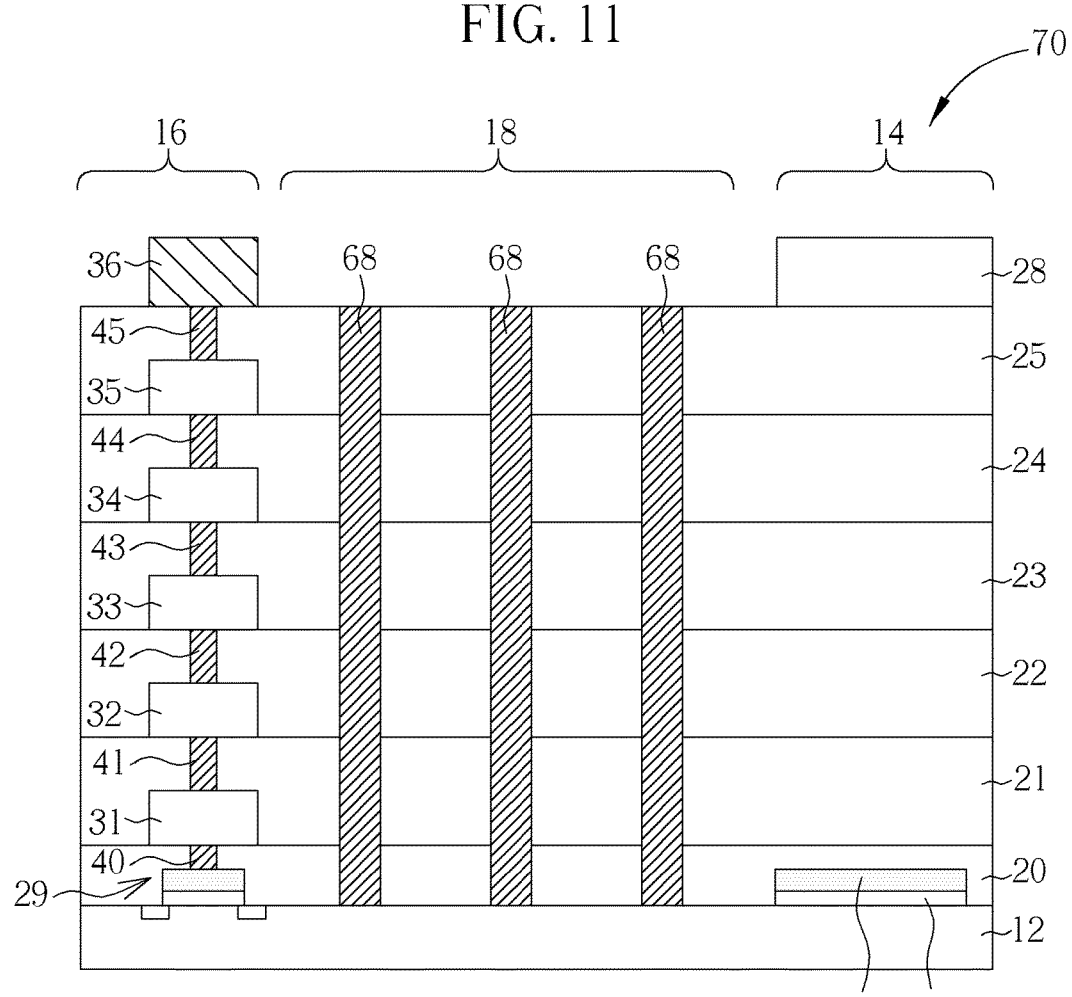
FIG. 12 is a schematic cross-sectional view showing another embodiment of the integrated structure for a MEMS device and a semiconductor device according to the present invention.

FIG. 12 is a schematic cross-sectional view showing another embodiment of the present invention. The integrated structure 70 for a MEMS device and a semiconductor device includes an etch stopping device attained though the formation of only a plurality of rows of a plurality of pillared etch-resistant material plugs 68. Likewise, in the present invention, the etch stopping device may be attained though the formation of only one or a plurality of wall-shaped etch-resistant material plugs.

All combinations and sub-combinations of the above-described features also belong to the present invention. Those skilled in the art will readily observe that numerous modifications and alterations of the device and method may be made while retaining the teachings of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating an integrated structure for a MEMS device and a semiconductor device, comprising:
   providing a substrate, wherein the integrated structure comprises a MEMS region including a first portion of the substrate and an area directly above the first portion of the substrate, an etch stopping device region including a second portion of the substrate and an area directly above the second portion of the substrate, and a semiconductor device region including a third portion of the substrate and an area directly above the third portion of the substrate, the MEMS region is separated from the semiconductor device region by the etch stopping device region, a transistor is disposed on the substrate in the semiconductor device region, and a first MEMS component is disposed on the substrate in the MEMS region;
   performing a interconnect process on the substrate in the semiconductor device region to form a plurality of first dielectric layers, at least a conductive plug and at least a conductive layer in the first dielectric layers;
   forming a plurality of second dielectric layers and an etch stopping device in the second dielectric layers on the substrate in the etch stopping device region;
   forming a plurality of third dielectric layers and at least a second MEMS component in the third dielectric layers on the substrate in the MEMS region;
   forming a top conductive layer on the first dielectric layers to electrically connect to the conductive plug and the conductive layer in the first dielectric layers;
   forming a passivation layer to cover the top conductive layer but not covering the second MEMS component; and
   performing an etching process to remove the third dielectric layers in the MEMS region.

2. The method of claim 1, wherein the etch stopping device is formed simultaneously with the at least a conductive plug or the at least a conductive layer when performing the interconnect process.

3. The method of claim 2, wherein the interconnect process comprises a damascene process or a dual damascene process.

4. The method of claim 1, wherein the etch stopping device comprises a plurality of pillared etch-resistant material plugs arranged in a plurality of rows.

5. The method of claim 4, wherein the etch stopping device further comprises an etch resistant material layer stacked with the pillared etch-resistant material plugs.

6. The method of claim 1, wherein the etch stopping device comprises at least a wall-shaped etch-resistant material plug.

7. The method of claim 6, wherein the etch stopping device further comprises an etch resistant material layer stacked with the at least a wall-shaped etch-resistant material plug.

8. The method of claim 1, wherein the at least a second MEMS component and one of the at least a conductive plug and the at least a conductive layer are formed simultaneously when performing the interconnect process.

9. The method of claim 1, wherein the etching process comprises a wet etching or a vapor etching.

10. The method of claim 1, wherein the second MEMS component not directly contacting the first MEMS component.

* * * * *